(12) United States Patent
Uchino et al.

(10) Patent No.: US 8,395,301 B1
(45) Date of Patent: Mar. 12, 2013

(54) HIGH POWER SINGLE CRYSTAL PIEZOELECTRIC TRANSFORMER

(75) Inventors: Kenji Uchino, State College, PA (US); Yuan Zhuang, State College, PA (US); Seyit O Ural, State College, PA (US); Ahmed Amin, North Attleboro, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 293 days.

(21) Appl. No.: 12/962,834

(22) Filed: Dec. 8, 2010

(51) Int. Cl.
*H01L 41/047* (2006.01)

(52) U.S. Cl. .................................. 310/357; 310/366

(58) Field of Classification Search .......... 310/357–360, 310/365, 366
See application file for complete search history.

(56) References Cited

U.S. PATENT DOCUMENTS

| | | | |
|---|---|---|---|
| 5,757,104 A * | 5/1998 | Getman et al. | 310/317 |
| 6,614,144 B2 * | 9/2003 | Vazquez Carazo | 310/359 |

* cited by examiner

*Primary Examiner* — Derek Rosenau
(74) *Attorney, Agent, or Firm* — James M. Kasischke; Michael P. Stanley; Jean-Paul A. Nasser

(57) ABSTRACT

A piezoelectric transformer includes a single crystal relaxor ferroelectric element poled along a [0$\bar{1}$1] direction and selected from the group consisting of PZN-PT, PMN-PZT, PZN-PT and PMN-PT. The element has two opposed surfaces substantially perpendicular to the [0$\bar{1}$1] direction with an input electrode and an output electrode positioned on one surface. The output electrode is isolated from electrical communication with the input electrode. A ground electrode is positioned on the second, opposed surface. Input electrical energy results in piezoelectric change in the element that is mechanically coupled through the element to generate piezoelectric output energy.

10 Claims, 4 Drawing Sheets

HIGH POWER SINGLE CRYSTAL PIEZOELECTRIC TRANSFORMER

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION (1) Field of the Invention

The present invention is directed generally towards piezoelectric transformers, and in particular, to improvements in efficiency and power density for high power single crystal piezoelectric transformers. Naval and commercial applications of the present invention include compact AC/DC or DC/DC adaptor/chargers for personal computers, communication devices, and portable x-ray units. The transformer can be combined to drive ultrasonic motors and motion devices for integration with unmanned autonomous vehicles in lieu of electromagnetic devices, thereby eliminating electromagnetic radiation and interference problems with navigation devices.

(2) Description of the Prior Art

A piezoelectric transformer is a two-port element that steps up or steps down AC voltages or current via converse and direct piezoelectric effects. These devices were developed in the late 1950's, and described for example, in C. Rosen's U.S. Pat. No. 2,974,296 incorporated by reference herein in its entirety for background information only.

The first commercial realization for piezoelectric transformers was in the early 1990s as a voltage step-up to ignite the cold cathode fluorescent tube "CCFT" for backlighting flat screens in displays and notebook computers.

Compared with the conventional transformer, which uses magnetic coupling between input and output, the piezoelectric transformer uses acoustic coupling. Generally, the input and output parts of the piezoelectric transformer have separate electrodes. An input voltage is applied to drive the device at the resonance frequency, and the mechanical vibration is transformed to the electrical output through the piezoelectric effect.

Piezoelectric transformers exhibit many advantages over electromagnetic transformers. They possess higher power density, no electromagnetic noise, better efficiency at resonance, easier miniaturization, and simpler fabrication.

Virtually all current piezoelectric transformers are fabricated from piezoelectric ceramics such as lead zirconate titanate, Pb(Zr,Ti)O3 (PZT) and its derivatives. Transformer geometries and polarization patterns that are suitable for piezoelectric ceramic processes are discussed in the Rosen patent. Mainly, two polarization schemes have been in use for piezoelectric transformers, and they are still in use to date: transversely polarized regions for input and output, or a continuously polarized element.

Subsequent advances on the original Rosen patent include: multilayer transformers given in S. Priya et al., Multilayered Unipoled Piezoelectric Transformers, Japanese Journal of Applied Physics Vol. 43, No. 6A, 2004, pp. 3503-3510 (2004); R. Bishop et al., U.S. Pat. No. 5,834,882; a thickness mode vibration piezoelectric transformer, by T. Inoue et al., U.S. Pat. No. 5,118,982; and a multimode adjustable piezoelectric transformer by Y. Lee et al., U.S. Pat. No. 5,504,384.

Each of the above patents is herein incorporated by reference in their entirety for background information only.

Ferroelectric single crystals, such as $Pb(Zn_{1/3}Nb_{2/3})$, $O_3$-$PbTiO_3$(PZN-PT) and $Pb(Mg_{1/3}Nb_{2/3})O_3$-$PbTiO_3$ (PMN-PT), exhibit large electromechanical coupling coefficients and high electric field induced strains. Due to these advantages compared to traditional polycrystalline piezoelectric ceramics, single crystals are a promising alternative to develop new generation devices.

U.S. Pat. No. 6,674,222 to Masters et al., herein incorporated by reference in its entirety for background information only, describes a Rosen-type single crystal PZN-PT transformer design. First, the noted low mechanical $Q_m$ of single crystal PZN-PT is a serious drawback and limits the transformer to low power applications. As is well-known, low mechanical $Q_m$ piezoelectric materials cannot sustain high power levels because of overheating. Second, the transformer designs presented in the Masters patent, with the exception of one type are suitable for piezoelectric ceramic elements but not for single crystals for the following fundamental reasons.

The crystallographic symmetry of an unpolarized body is consistent with the spherical Curie group ∞/∞ (mm). Therefore, Rosen-type transformers (plates, discs, etc.) with two orthogonally polarized regions each possessing the symmetry of ∞ (mm) can be easily fabricated.

Nonetheless, this is not true for the relaxor-ferroelectric single crystals such as PZN-PT. (In relaxor ferroelectric materials the dielectric constant decreases when the material is subjected to an increasing electrical frequency.) In this case, there exists definite directions in the crystals where the polarization vector is allowed. Other directions are forbidden and this fact must be considered as an integral part of any single crystal transformer design rules and the selection of the vibration modes.

The two major problems with the Masters relaxor-ferroelectric PZN-PT single crystal patent are: in high power applications, the low mechanical $Q_m$, leads to device overheating and eventual destruction of the transformer; and, most of the proposed designs are not commensurate with the allowed polarization directions in the crystal. This latter deficiency makes it impossible to reduce the design to practice.

SUMMARY OF THE INVENTION

Accordingly it is an object of the present invention to provide a piezoelectric transformer to overcome the above and other shortcomings in the prior art.

The inventive piezoelectric transformer includes a single crystal relaxor ferroelectric element poled along a [0$\bar{1}$1] direction and selected from the group consisting of PZN-PT, PMN-PZT, PZN-PT and PMN-PT. The element has two opposed surfaces substantially perpendicular to the [0$\bar{1}$1] direction with an input electrode and an output electrode positioned on one surface. The output electrode is isolated from electrical communication with the input electrode. A ground electrode is positioned on the second, opposed surface. Input electrical energy results in piezoelectric change in the element that is mechanically coupled through the element to generate piezoelectric output energy.

Other objects and advantages of the present invention will become apparent from the following description, drawings and claims.

BRIEF DESCRIPTION OF THE DRAWINGS

The following drawings are not drawn to scale.

DETAILED DESCRIPTION OF THE INVENTION

The key advances of the present invention over the single crystal PZN-PT and piezoceramic PZT materials previously used in transformers have been experimentally verified. The following advances have been shown.

Figure 1A:
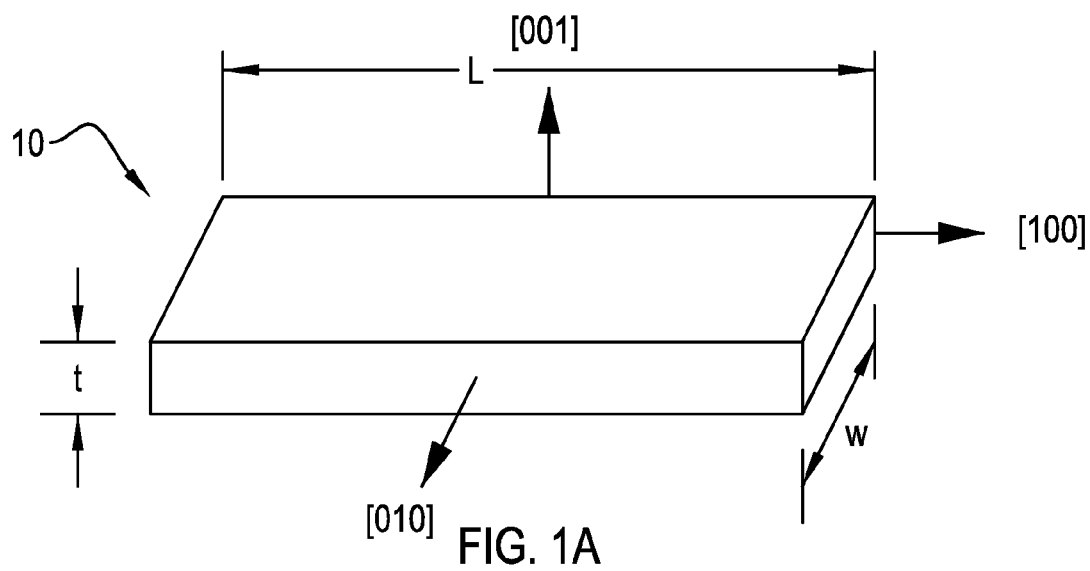
FIG. 1A is a prospective view of a first crystal orientation of a rectangular transformer plate.
Figure 1B:
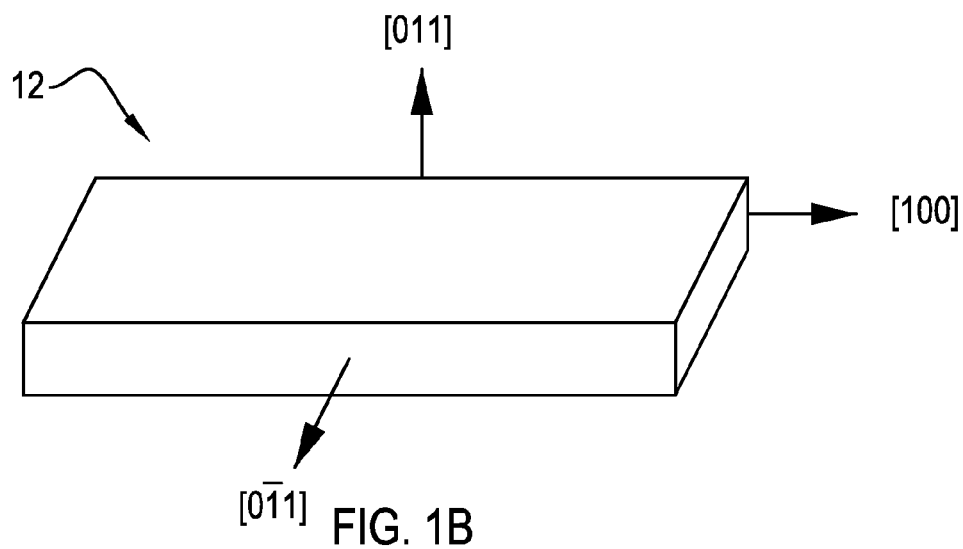
FIG. 1B is a prospective view of a second crystal orientation of a rectangular transformer plate.
Figure 1C:
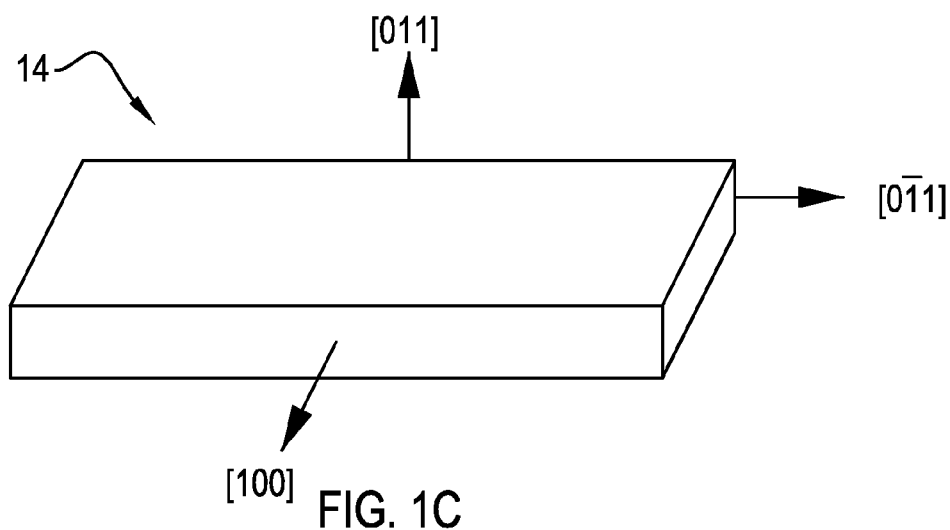
FIG. 1C is a prospective view of a third crystal orientation of a rectangular transformer plate.

Two incongruent crystallographic orientations have been shown to exist that are suitable for high power transformers as shown in FIG. 1B, sample 5, $k_{32}$ and FIG. 1C sample 6, $k_{31}$.

Acceptor-doping with manganese into the $k_{31}$ and $k_{32}$ crystallographic orientations has been shown, whereby the mechanical $Q_m$ (see Table I, below) was enhanced to levels approaching six times of the reported value in the prior art for single crystal PZN-PT. This occurred without affecting the high electromechanical coupling. The power density of piezoelectric transformer is related with the mechanical quality factor $Q_m$, and the electromechanical coupling coefficient k.

Fabrication of a thermally stable high power density single crystal transformer is shown with up to five times the power density of hard PZT piezoceramics and 45% higher efficiency (see the results in Table I). This can result in either an 80% size and weight reduction of current PZT transformers for the same power output, or a five-fold increase in the power output for the same size transformer.

Alternate, easily polarized and manufactured transformer designs (see FIGS. 4A, 4B, 5A and 5B) have also been developed that do not violate the crystallographic design rules.

Table I below lists empirically derived data of various materials tested for use in a piezoelectric transformer, including maximum power densities and efficiencies, mechanical quality factors, and electromechanical coupling coefficients for each material.

Specifically, the six samples tested with results provided in Table I are composed of well known single crystal materials. The APC 841 is a conventional PZT ceramic material used for transformers. Each of the PMN-PT samples were derived with different orientations as shown in FIGS. 1A, 1B and 1C. Notice that samples 4 and 5 were doped with manganese. Testing was also performed on samples doped with indium and iron, however, the best results were obtained by doping with manganese.

For each sample, the maximum power density was measured in watts per cubic centimeter, maximum efficiency was calculated using the input and output power, the mechanical quality factor $Q_m$ was measured, and the electromechanical coupling coefficient $k_{31}$ was measured.

TABLE I

| Sample No. | Material | Max. Power Density (W/cm³) | Max. Efficiency | $Q_m$ | $k_{31}$ or $k_{32}$ |
|---|---|---|---|---|---|
| 1 | APC 841 hard PZT ceramic | 7.7 | 0.66 | 1100 | 0.30 |
| 2 | PMN-PT (L[100] w[010] t[001]) | 1.1 | 0.33 | 150 | 0.40 ($k_{31}$) |
| 3 | PMN-PT (L[0$\bar{1}$1] w[100] t[011]) | 11.8 | 0.86 | 150 | 0.88 ($k_{31}$) |
| 4 | Mn-PMN-PT (L[100] w[010] t[001]) | 5.2 | 0.88 | 250 | 0.50 ($k_{31}$) |
| 5 | Mn-PMN-PT (L[100] w[0$\bar{1}$1] t[011]) | 30.1 | 0.96 | 320 | 0.61 ($k_{32}$) |
| 6 | Mn-PMN-PT (L[0$\bar{1}$1] w[100] t[011]) | 38.1 | 0.93 | 220 | 0.83 ($k_{31}$) |

We have experimentally proven that the single crystal piezoelectric transformer of the present invention exhibits much better performance in terms of power density than the conventional hard piezoceramic PZT transformers, if the poling direction, cutting orientation, and dopant type are selected properly. The advantage is significant for the devices of power density larger than 10 W/cm³ as is evident when examining the results of Table I. Generally, various types and configurations of transformers can be improved by using single crystal materials, such as $Pb(Mg_{1-x}Nb_x)O_3$-$PbTiO_3$ (PMN-PT) and $Pb(Zr_{1-x}Nb_x)O_3$-$PbTiO_3$ (PZN-PT).

FIG. 1A is a perspective view of a rectangular transformer plate 10 having a length L, a width w, and a thickness t and having a crystal orientation of L[100],w[010],t[001]. FIG. 1B shows a rectangular transformer plate 12 with a second crystal orientation of L[100],w[0$\bar{1}$1],t[011], and FIG. 1C shows a rectangular transformer plate 14 with third crystal orientation of L[0$\bar{1}$1],w[100],t[011].

Figure 2:
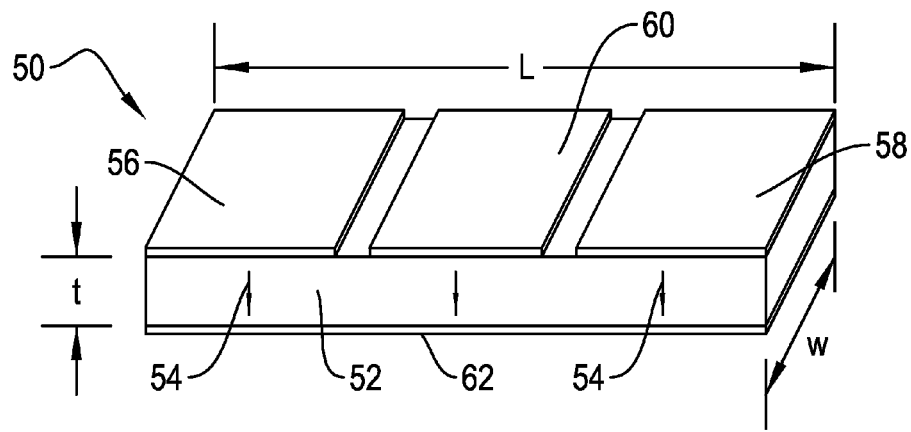
FIG. 2 is a perspective view of a rectangular piezoelectric plate transformer with segmented electrodes.

FIG. 2 is a perspective view of a piezoelectric plate transformer 50 for a first embodiment having a length L, a width w, and a thickness t. Transformer 50 is made from relaxor ferroelectric single crystal piezoelectric material 52 poled in the thickness direction t as shown by arrows 54. The transformer 50 includes two input electrodes 56, 58, an output electrode 60, and a ground electrode 62.

It should be noted that the configuration with uni-directional poling is preferred in the sense of simplicity and production cost, considering the manufacturing process of relaxor-based piezoelectric single crystals. Initially 17×3×31 mm plates of lead zirconate titanate (PZT) ceramics, undoped and manganese-doped PMN-PT single crystals were manufactured. Properties of these materials are listed in Table I.

Specifically, hard PZT APC84 I (a product of APC International) was utilized, and the 0.79 $Pb(Mg_{1/3}Nb_{2/3})O_3$-0.21$PbTiO_3$ single crystal samples were fabricated using a solid-state crystal growth (SSCG) technique such as that taught in U.S. Patent Application Publication No. 2009/0211515. Other techniques can be used for this. The single crystals were cut in three orientations (see FIGS. 1A, 1B, 1C):
L[100],w[010], t[001],
L[100],w[0$\bar{1}$1],t[011], and
L[0$\bar{1}$1], w[100], t[011].

Next the top electrode was separated into three parts 56, 58, and 60 (each 5 mm in length in the current embodiment), and the bottom electrode 62 was left as the common ground. In this embodiment, the center portion 60 of the top electrode was used for output as an output electrode, and portions 56 and 58 were used for input as input electrodes. Under the input and output configuration of FIG. 2, the transformer worked as a voltage booster (step-up transformer). The experimental results and material properties are also summarized in Table I.

The maximum power density is defined as the output power per unit specimen volume when the temperature of the sample's nodal point rises by 10° C. above room temperature. For single crystals, $Q_m$ and $k_{31}$ varied with poling direction and cutting orientation. The mechanical quality factors were enhanced by hard doping (with manganese in the preferred embodiment) during the crystal formulation process. The efficiency and power density are generally related with the product of $Q_m$ and $K^2$.

Materials with high mechanical quality factor and coupling coefficient are preferred in the transformer application. Compared to PZT ceramics, single crystals have a relatively small mechanical quality factor $Q_m$, but significantly higher coupling coefficients k. Therefore, as shown by the results of Table I, fabrication and testing of several single crystal samples showed better high power performances than ceramics, and the power density of 38 W/cm3 was observed for Sample 6 in Table I, which was 5 times that of the PZT Sample 1 of Table I, also shown in FIG. 3. Single crystal elements were tested using manganese, indium and iron as dopants. While indium and iron had some beneficial effect, the best results were obtained using manganese.

Empirical test prove that hard doping is essential to increase the mechanical quality factor and the power density of the single crystal. Poling along the [0$\bar{1}$1] direction exhibits higher power density than the [001] direction.

In the experiment, sinusoidal signals were produced by a function generator and amplified by a power amplifier. Each sample was driven in the $k_{31}$ vibration mode around the second resonant frequency. A 1.5 kΩ resistor was connected to the output as the load, which is close to the matching impedance, and the output power was kept constant throughout one frequency sweep. An infrared spot thermometer was used to monitor the temperature rise at the center of the plate, i.e., the nodal point of the sample with the maximum heat generation. Each sample was run for several sweeps with different output power levels, while all the data including voltages, currents, and temperatures were logged. The maximum power density is defined as the output power per unit volume when the temperature of the sample's nodal point rises by 10° C. above room temperature. Furthermore, the voltage gain and efficiency were simultaneously calculated using the input and output data.

Figure 3A:
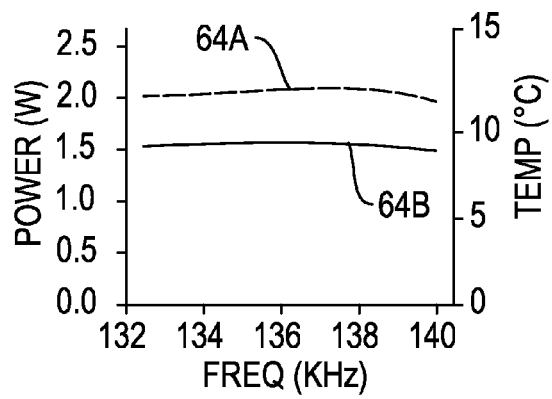
FIG. 3A is a graph of experimental results of output power in watts and temperature rise in degrees Celsius versus frequency in KHz for a transformer sample using Mn doped PMN-PT (L[0$\bar{1}$1],w[100],t[011]) in accordance with the principles of the present invention.
Figure 3B:
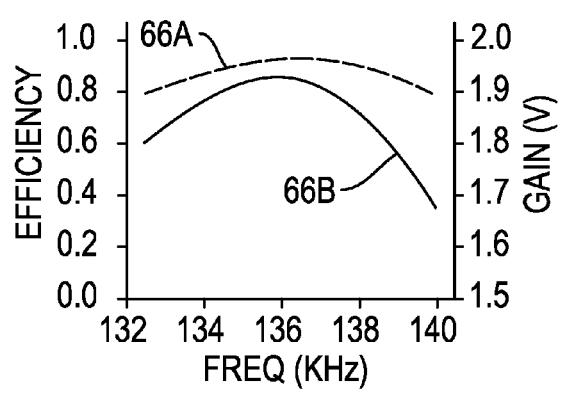
FIG. 3B is a graph of experimental results of efficiency and voltage gain versus frequency in KHz for a transformer sample using Mn doped PMN-PT (L[0$\bar{1}$1]w[100]t[011]) in accordance with the principles of the present invention.

FIGS. 3A and 3B give generalized test results for Sample 6 Mn-PMN-PT L[0$\bar{1}$1],w[100],t[011], the sample having the best measured power density. In FIG. 3A the output power versus frequency measurements were plotted as shown by the dotted line 64A, and the temperature rise versus frequency measurements were plotted as shown by the solid line 64B. In FIG. 3B the efficiency versus frequency measurements were plotted as shown by the dotted line 66A, and the voltage gain versus frequency measurements were plotted as shown by the solid line 66B.

Figure 4A:
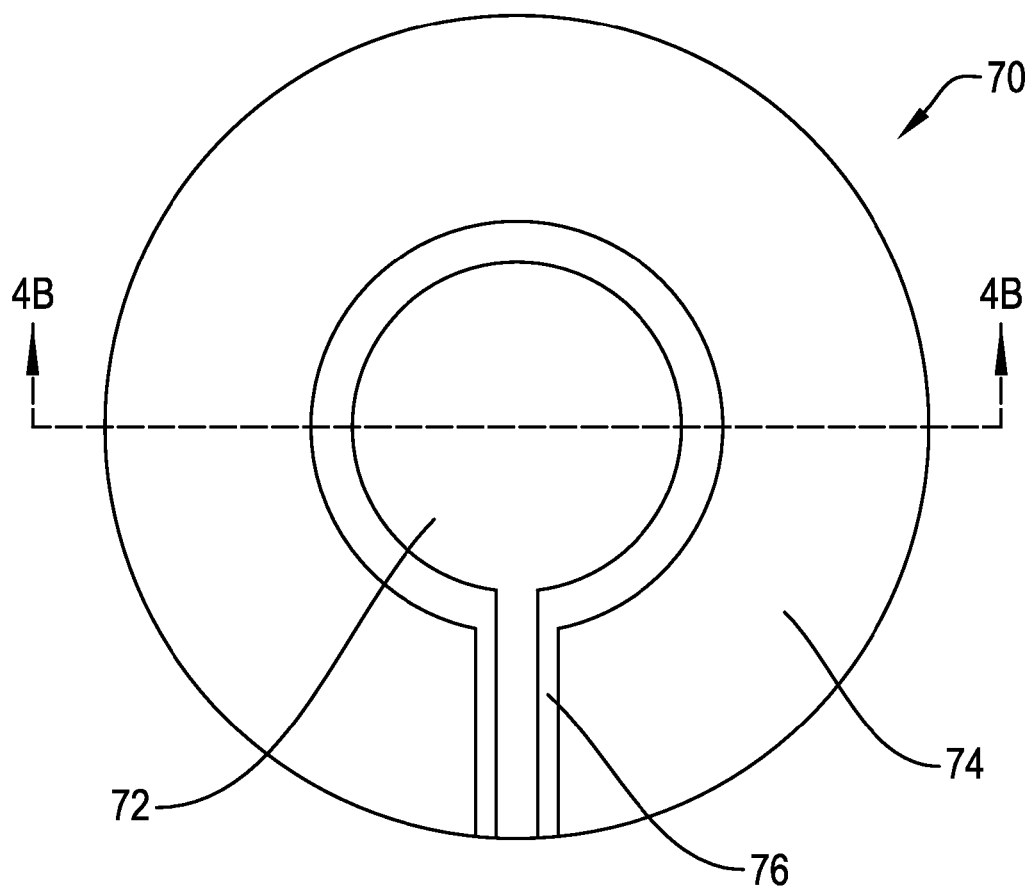
FIG. 4A is a top view of a uni-poled disk shaped piezoelectric transformer having a ring-dot electrode pattern.
Figure 4B:
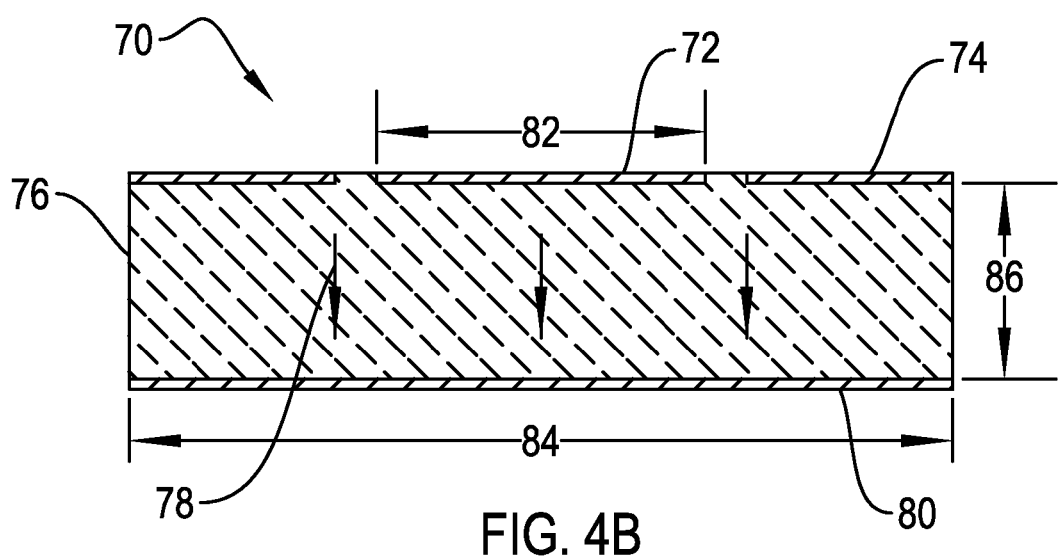
FIG. 4B is a cross-sectional view of the disk shaped piezoelectric transformer of FIG. 4A, illustrating a poling direction.

A second embodiment and suitable configuration for the application of a single crystal transformer is illustrated in FIGS. 4A and 4B. FIG. 4A is a top view of a uni-poled transformer 70 having a ring-dot electrode pattern. Ring-dot electrode pattern has an inner electrode 72 and an outer electrode 74 formed on one surface of a single crystal piezoelectric element 76. Section line 4B indicates the section line for FIG. 4B. FIG. 4B shows uni-poled transformer 70 in section. Inner electrode 72 and outer electrode 74 are shown in section on top of single crystal piezoelectric element 76. Element 76 is poled in the direction shown by arrows 78. A ground electrode 80 is positioned on an opposite surface of element 76 from the inner electrode 72 and outer electrode 74. Inner electrode 72 has an inner electrode diameter 82, and an outer electrode 74 has an outer electrode diameter 84. A distance 86 separates the top and bottom surfaces of element 76. The areas of inner and outer electrodes 72 and 74 determine the step-up ratio, efficiency, and impedance characteristics. The disk-shaped transformer of this embodiment exhibited better performance than the rectangular plate-shape in terms of power density.

Many other embodiments of the present invention are available such as multilayer structures, i.e., stacking of layers, which can be utilized to further improve the power level. A multi-layer design as in FIGS. 5A and 5B can provide high gain and high power at a lower cost. These multi-layer designs use an electrode pattern similar to that shown in FIG. 4A and FIG. 4B wherein an input electrode surrounds an output electrode and appears in two places because of the cross-sectional view.

Figure 5A:
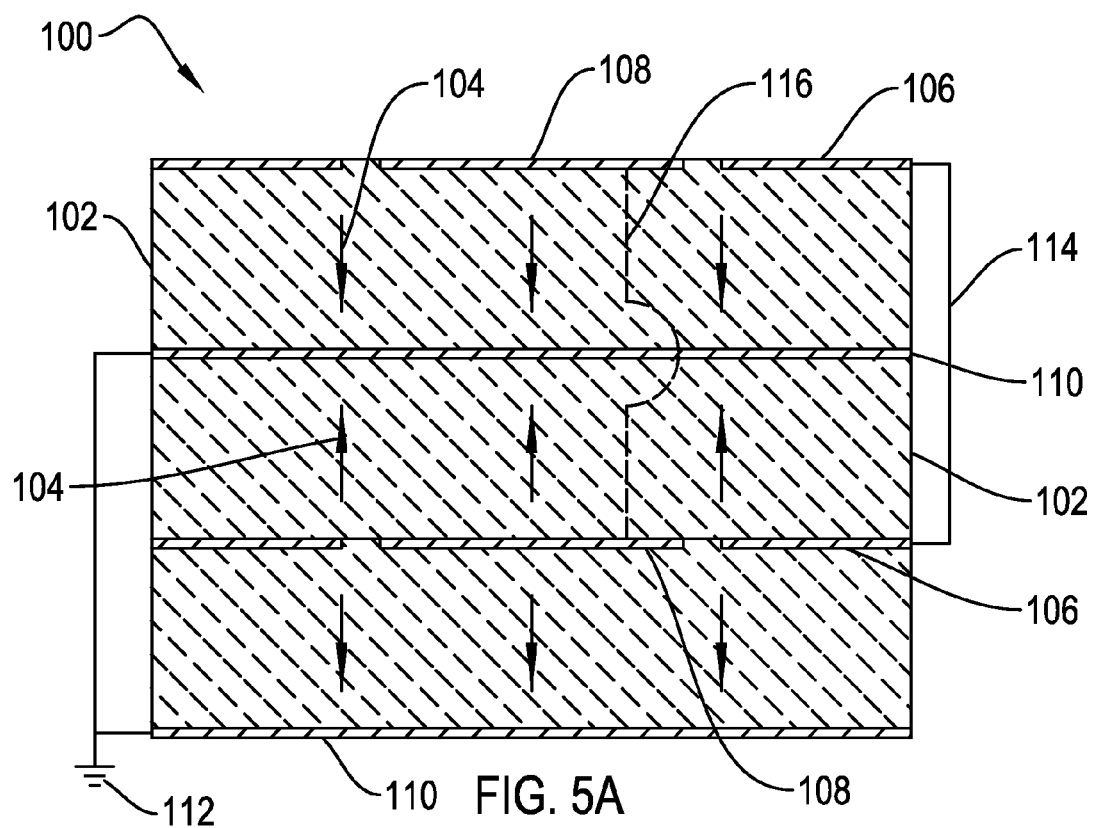
FIG. 5A is a cross-sectional layout view of a multilayer disk shaped transformer having a common ground.

FIG. 5A is a cross-sectional view of a multi-layer disk-shaped transformer 100 having a first configuration. In this embodiment, there are multiple single crystal piezoelectric elements 102, each element 102 having two faces perpendicular to a poling direction 104. Elements 102 are stacked with opposing poling directions 104. An input electrode 106 and an output electrode 108 are in electrical communication with one face of element 102. A ground electrode 110 is in electrical communication with the other face of element 102. Ground electrodes 110 are joined to a ground 112. Adjacent elements 102 share either the input electrode 106 and output electrode 108 or ground electrode 110 with the adjacent element. Input electrodes 106 on different layers are joined by a conductor 114. Output electrodes 108 on different elements 102 are electrically joined by, for example, a hidden conductor 116.

Figure 5B:
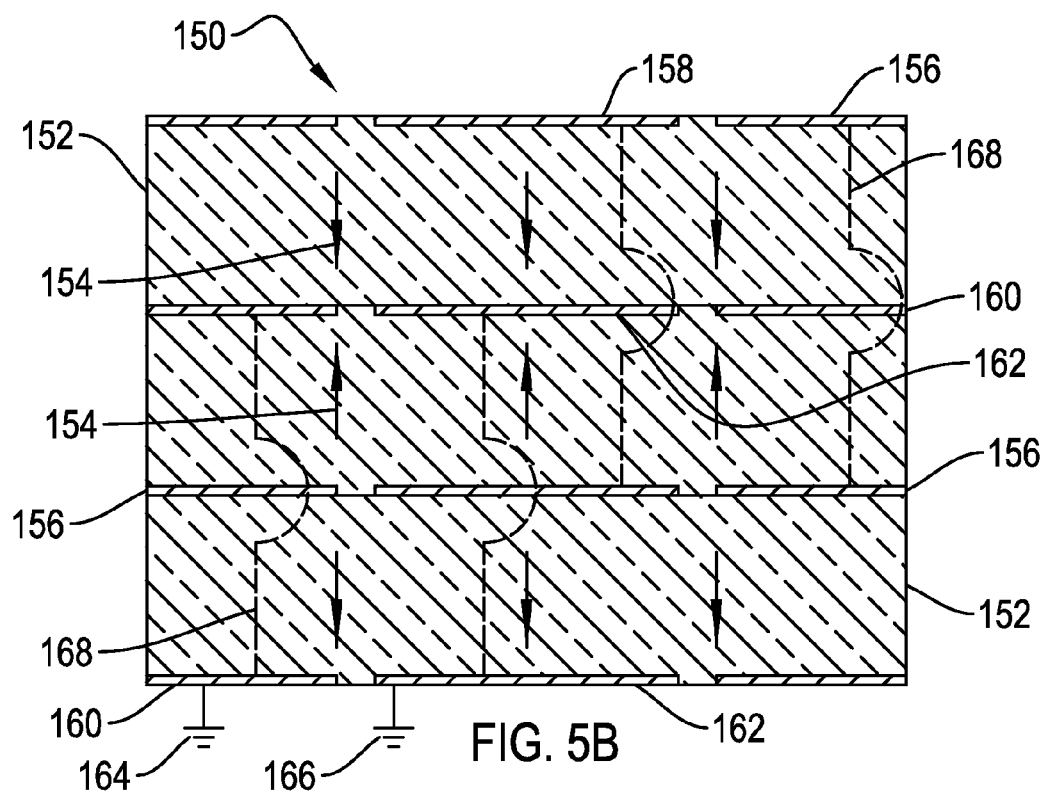
FIG. 5B is a cross-sectional layout view of a multilayer disk shaped transformer having separated or floating type grounds.

FIG. 5B is a cross-sectional view of a multi-layer disk-shaped transformer 150 having a second configuration. This embodiment also has multiple single crystal piezoelectric elements 152. Each element 152 has two opposed faces perpendicular to a poling direction 154. Elements 152 are stacked with opposing poling directions 154. Input electrodes 156 and output electrodes 158 are in electrical communication with one face of each element 152. An input ground electrode 160 and an output ground electrode 162 are in electrical communication with the other face of element 152. Input ground electrodes 160 are joined to an input ground 164. Output ground electrodes 162 are joined to an output ground 166. Adjacent elements 152 share either input electrodes 156 and output electrodes 158 or ground electrodes 160 and 162 with the adjacent element. Input electrodes 156 on different layers are electrically joined by hidden conductors 168. Output electrodes 158 are also joined by hidden conductors 168. Input ground electrodes 160 are joined to each other, as are output ground electrodes 162 by hidden conductors 168. In this embodiment, through isolating the input ground and the output ground, it is believed that an output signal free of interference from the input signal will result.

It will be understood that additional variations and alternatives in the details, materials, steps and arrangement of parts, which have been herein described and illustrated in order to explain the nature of the invention, may be made as understood by those skilled in the art within the principles and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A piezoelectric transformer comprising:
    a single crystal relaxor ferroelectric element poled along a [0$\bar{1}$1] direction and selected from the group consisting of PZN-PT, PMN-PZT, PZN-PT and PMN-PT, said element having two opposed surfaces substantially perpendicular to the [0$\bar{1}$1] direction;
    an input electrode positioned on a first one of said element two opposed surfaces;
    an output electrode positioned on a first one of said element two opposed surfaces, said output electrode being electrically isolated from said input electrode; and
    a ground electrode positioned on a second one of said element two opposed surfaces.

2. The apparatus of claim 1 wherein said single crystal relaxor ferroelectric element is hard doped with a material selected from manganese, iron and indium.

3. The apparatus of claim 1 wherein said single crystal relaxor ferroelectric element is hard doped with manganese.

4. The apparatus of claim 3 wherein said single crystal relaxor ferroelectric element is made from PMN-PT.

5. A piezoelectric transformer comprising:
    at least two single crystal relaxor ferroelectric element poled along a [0$\bar{1}$1] direction and selected from the group consisting of PZN-PT, PMN-PZT, PZN-PT and PMN-PT, each said element having two opposed surfaces substantially perpendicular to the [0$\bar{1}$1] direction;
    an input electrode positioned on a first one of said element two opposed surfaces;
    an output electrode positioned on a first one of said element two opposed surfaces, said output electrode being electrically isolated from said input electrode; and
    at least one ground electrode positioned on a second one of said element two opposed surfaces;
    wherein said at least two single crystal relaxor ferroelectric elements are stacked with opposing pole directions, said adjacent stacked elements sharing a selected one of said ground electrode and both said input electrode and said output electrode.

6. The apparatus of claim 5 wherein said single crystal relaxor ferroelectric element is hard doped with a material selected from manganese, iron and indium.

7. The apparatus of claim 5 wherein said single crystal relaxor ferroelectric element is hard doped with manganese.

8. The apparatus of claim 7 wherein said single crystal relaxor ferroelectric element is made from PMN-PT.

9. The apparatus of claim 5 wherein said at least one ground electrode comprises:
    an input ground electrode for use as ground with said input electrodes; and
    an output ground electrode for use as ground with said output electrodes.

10. The apparatus of claim 9 wherein said input ground electrode is electrically isolated from said output ground electrode.

* * * * *

UNITED STATES PATENT AND TRADEMARK OFFICE
CERTIFICATE OF CORRECTION

PATENT NO. : 8,395,301 B1  
APPLICATION NO. : 12/962834  
DATED : March 12, 2013  
INVENTOR(S) : Kenji Uchino et al.

It is certified that error appears in the above-identified patent and that said Letters Patent is hereby corrected as shown below:

Title Page Item [57] In the abstract, line 2, replace "$[0\bar{1}1]$" with --[011]--;
Title Page Item [57] In the abstract, line 3, delete "PZN-PT,";
Title Page Item [57] In the abstract, line 5, replace "$[0\bar{1}1]$" with --[011]--;

In the Specification:

At column 2, line 47, replace "$[0\bar{1}1]$" with --[011]--;
At column 2, line 48, delete "PZN-PT,";
At column 2, line 50, replace "$[0\bar{1}1]$" with --[011]--;

In the Claims:

In claim 1, line 3, replace "$[0\bar{1}1]$" with --[011]--;
In claim 1, line 4, delete "PZN-PT,";
In claim 1, line 6, replace "$[0\bar{1}1]$" with --[011]--;
In claim 5, line 3, replace "$[0\bar{1}1]$" with --[011]--;
In claim 5, line 4, delete "PZN-PT,"; and
In claim 5, line 6, replace "$[0\bar{1}1]$" with --[011]--.

Signed and Sealed this
Fourteenth Day of May, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,395,301 B1
APPLICATION NO. : 12/962834
DATED : March 12, 2013
INVENTOR(S) : Kenji Uchino et al.

It is certified that error appears in the above-identified patent and that said Letters Patent is hereby corrected as shown below:

Title Page Item [57] In the abstract, line 2, replace " $[0\bar{1}1]$ " with --[011]--;
Title Page Item [57] In the abstract, line 3, delete "PZN-PT,";
Title Page Item [57] In the abstract, line 5, replace " $[0\bar{1}1]$ " with --[011]--;

In the Specification:

At column 2, line 47, replace " $[0\bar{1}1]$ " with --[011]--;
At column 2, line 48, delete "PZN-PT,";
At column 2, line 50, replace " $[0\bar{1}1]$ " with --[011]--;

In the Claims:

Column 7, line 19 (claim 1, line 3) replace " $[0\bar{1}1]$ " with --[011]--;
Column 7, line 20 (claim 1, line 4) delete "PZN-PT,";
Column 7, line 22 (claim 1, line 6) replace " $[0\bar{1}1]$ " with --[011]--;
Column 8, line 3 (claim 5, line 3) replace " $[0\bar{1}1]$ " with --[011]--;
Column 8, line 4 (claim 5, line 4) replace "PZN-PT,"; and
Column 8, line 6 (claim 5, line 6) replace " $[0\bar{1}1]$ " with --[011]--.

This certificate supersedes the Certificate of Correction issued May 14, 2013.

Signed and Sealed this
Eleventh Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,395,301 B1  
APPLICATION NO. : 12/962834  
DATED : March 12, 2013  
INVENTOR(S) : Kenji Uchino et al.

Page 1 of 1

It is certified that error appears in the above-identified patent and that said Letters Patent is hereby corrected as shown below:

Title Page, below Item (75),

"(73) Assignee: The United States of America as represented by the the Secretary of the Navy, Washington, DC (US)"

Should read

--(73) Assignees: The United States of America as represented by the the Secretary of the Navy, Washington, DC (US)

The Penn State Research Foundation
304 Old Main
University Park, Pennsylvania 16802--

Signed and Sealed this
Twenty-fourth Day of September, 2013

Teresa Stanek Rea
*Deputy Director of the United States Patent and Trademark Office*